(12) United States Patent
Chen et al.

(10) Patent No.: US 12,334,459 B2
(45) Date of Patent: *Jun. 17, 2025

(54) INTEGRATED CIRCUITS

(71) Applicant: Taiwan Semiconductor Manufacturing Company, Ltd., Hsinchu (TW)

(72) Inventors: Hsien-Wei Chen, Hsinchu (TW); Ming-Fa Chen, Taichung (TW); Sung-Feng Yeh, Taipei (TW); Ying-Ju Chen, Yunlin County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 307 days.

This patent is subject to a terminal disclaimer.

(21) Appl. No.: 17/969,694

(22) Filed: Oct. 20, 2022

(65) Prior Publication Data
US 2023/0040077 A1 Feb. 9, 2023

Related U.S. Application Data

(63) Continuation of application No. 16/859,914, filed on Apr. 27, 2020, now Pat. No. 11,495,559.

(51) Int. Cl.
*H01L 29/40* (2006.01)
*H01L 21/768* (2006.01)
(Continued)

(52) U.S. Cl.
CPC ........ *H01L 24/05* (2013.01); *H01L 21/76898* (2013.01); *H01L 23/481* (2013.01); *H01L 23/562* (2013.01); *H01L 24/08* (2013.01);

*H01L 24/80* (2013.01); *H01L 2224/05025* (2013.01); *H01L 2224/08145* (2013.01);
(Continued)

(58) Field of Classification Search
CPC . H01L 24/05; H01L 21/76898; H01L 23/481; H01L 23/562; H01L 24/08; H01L 24/80; H01L 2224/05025; H01L 2224/08145; H01L 2224/80895; H01L 2224/80896; H01L 2924/35121; H01L 2224/04105; H01L 24/16; H01L 24/13; H01L 24/81; H01L 2224/0401; H01L 2224/32145; H01L 2224/16227; H01L 24/06; H01L 2224/16145; H01L 2224/16237; H01L 25/0655; H01L 2224/83192; H01L 2224/73104; H01L 2225/06517; H01L 2224/2958;
(Continued)

(56) References Cited

U.S. PATENT DOCUMENTS 8,546,188 B2 * 10/2013 Liu .................. H01L 23/481
438/455
11,495,559 B2 * 11/2022 Chen .................. H01L 24/05
(Continued)

*Primary Examiner* — Niki H Nguyen
(74) *Attorney, Agent, or Firm* — JCIPRNET

(57) ABSTRACT

An integrated circuit includes a conductive pad. In some embodiments, the conductive pad includes at least one dielectric pattern therein, wherein the at least one dielectric pattern penetrates a surface of the conductive pad. In some embodiments, the conductive pad includes a conductive main body and at least one hole in the conductive main body, wherein the at least one hole penetrates a surface of the conductive main body.

20 Claims, 12 Drawing Sheets

(51) Int. Cl.
 *H01L 23/00* (2006.01)
 *H01L 23/48* (2006.01)
(52) U.S. Cl.
 CPC ............. *H01L 2224/80895* (2013.01); *H01L 2224/80896* (2013.01); *H01L 2924/35121* (2013.01)
(58) Field of Classification Search
 CPC ....... H01L 2224/05009; H01L 25/0753; H01L 21/8221
 See application file for complete search history.

(56) References Cited

U.S. PATENT DOCUMENTS

| | | | | |
|---|---|---|---|---|
| 2010/0032810 A1* | 2/2010 | Ding | ................ | H01L 24/13 257/E21.597 |
| 2010/0032811 A1* | 2/2010 | Ding | ................ | H01L 24/13 257/E21.597 |
| 2010/0178761 A1* | 7/2010 | Chen | ................ | H01L 23/49827 257/E21.585 |
| 2012/0261826 A1* | 10/2012 | Kuo | ................ | H01L 21/76898 257/E21.597 |
| 2014/0264709 A1* | 9/2014 | Tsai | ................ | H10F 39/199 438/26 |
| 2014/0357050 A1* | 12/2014 | Feng | ................ | H01L 21/76229 438/430 |
| 2015/0243583 A1* | 8/2015 | Li | ................ | H01L 23/481 257/774 |
| 2015/0279779 A1* | 10/2015 | Andry | ................ | H01L 23/528 438/667 |
| 2015/0357283 A1* | 12/2015 | Andry | ................ | H01L 23/5226 257/774 |
| 2020/0006266 A1* | 1/2020 | Chen | ................ | H01L 23/5283 |
| 2020/0035643 A1* | 1/2020 | Hirata | ................ | H01L 27/14634 |
| 2020/0091039 A1* | 3/2020 | Shao | ................ | H01L 24/11 |
| 2020/0194396 A1* | 6/2020 | Uzoh | ................ | H01L 25/50 |
| 2023/0019350 A1* | 1/2023 | Hwang | ................ | H01L 25/0652 |
| 2023/0050652 A1* | 2/2023 | Moon | ................ | H01L 24/80 |
| 2023/0245987 A1* | 8/2023 | Chuang | ................ | H01L 24/80 257/782 |
| 2023/0343677 A1* | 10/2023 | Wang | ................ | H01L 23/5283 |

\* cited by examiner

INTEGRATED CIRCUITS

CROSS-REFERENCE TO RELATED APPLICATION

This application is a continuation application of and claims the priority benefit of a prior application Ser. No. 16/859,914, filed on Apr. 27, 2020, now issued. The entirety of the above-mentioned patent applications is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
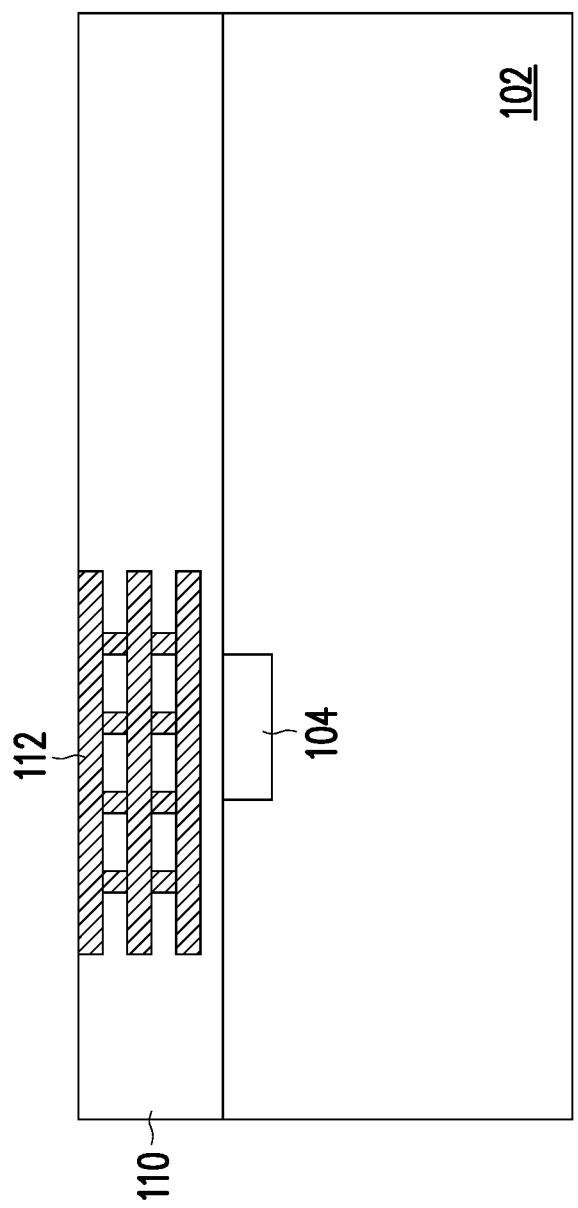
FIG. 1A to FIG. 1E illustrate cross-sectional views of a method of forming an integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E illustrate cross-sectional views of a method of forming an integrated circuit in accordance with some embodiments. FIG. 2 is a top view of a conductive pad of the integrated circuit of FIG. 1E.

Figure 2:
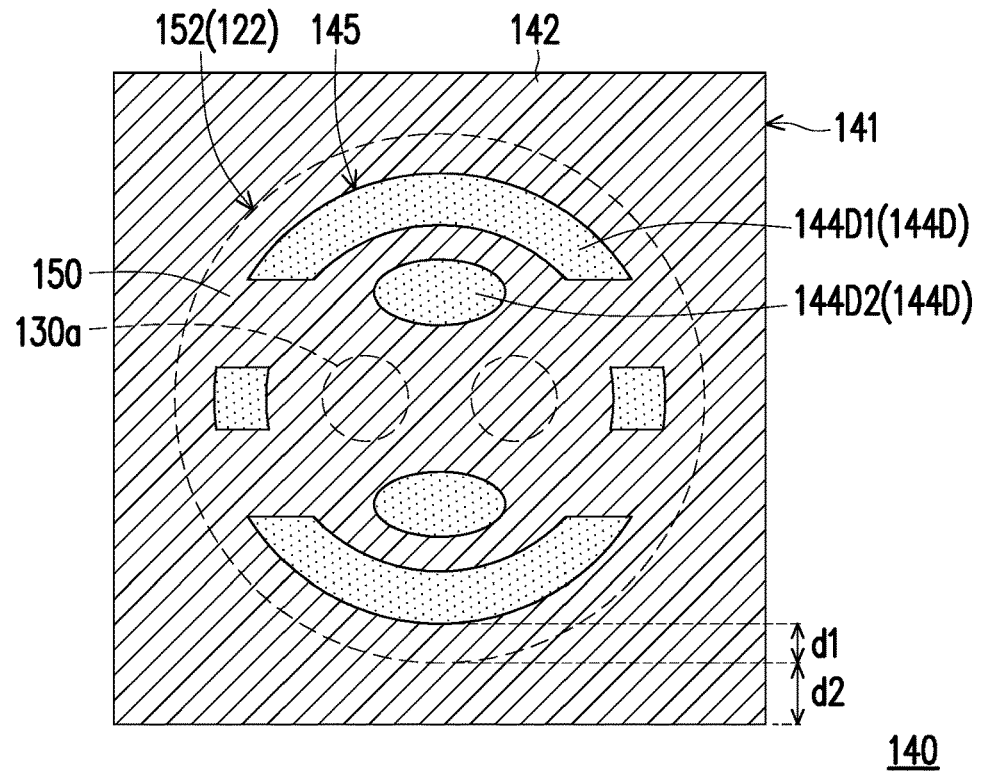
FIG. 2 is a top view of a conductive pad of the integrated circuit of FIG. 1E.

Referring to FIG. 1A, a substrate 102 is provided. In some embodiments, the substrate 102 includes an elementary semiconductor such as silicon or germanium and/or a compound semiconductor such as silicon germanium, silicon carbide, gallium arsenic, indium arsenide, gallium nitride or indium phosphide. In some embodiments, the substrate 102 is a semiconductor-on-insulator (SOI) substrate. In some alternative embodiments, the substrate 102 takes the form of a planar substrate, a substrate with multiple fins, nanowires, or other forms known to people having ordinary skill in the art. Depending on the requirements of design, the semiconductor substrate 102 may be a P-type substrate or an N-type substrate and may have doped regions therein. The doped regions may be configured for an N-type device or a P-type device.

In some embodiments, the substrate 102 includes isolation structures defining at least one active area, and a device layer is disposed on/in the active area. The device layer includes at least one device 104. In some embodiments, the device 104 includes an active component, a passive component, or a combination thereof. In some embodiments, the device 104 include an integrated circuits device. The device 104 is, for example, a transistor, a capacitor, a resistor, a diode, a photodiode, a fuse device, or other similar device.

In some embodiments, the device layer includes a gate structure, source/drain regions, spacers, and the like.

Then, a dielectric material 110 and a plurality of conductive patterns 112 are formed over the substrate 102. The dielectric material 110 and the conductive patterns 112 are disposed over a surface (e.g., front surface) of the substrate 102. In some embodiments, the dielectric material 110 is a multilayer structure. For example, the dielectric material 110 includes an inter-layer dielectric (ILD) layer on the substrate 102, and at least one inter-metal dielectric (IMD) layer over the inter-layer dielectric layer. In some embodiments, the dielectric material 110 includes extremely low-k dielectrics having a dielectric constant of about 2.1 or less, and extremely low-k dielectrics are generally low-k dielectrics formed into a porous structure. Porosity reduces the effective dielectric constant. In some alternative embodiments, the dielectric material 110 includes an oxide such as silicon oxide, phosphosilicate glass (PSG), borosilicate glass (BSG), boron-doped phosphosilicate glass (BPSG), a nitride such as silicon nitride, or the like. In some alternative embodiments, the dielectric material 110 includes low-k dielectrics having a smaller dielectric constant than silicon oxide, and examples of low-k dielectrics include organosilicate glasses (OSG) such as carbon-doped silicon dioxide and fluorine-doped silicon dioxide (otherwise referred to as fluorinated silica glass (FSG)). The dielectric material 110 may be formed any acceptable deposition process, such as spin coating, CVD, laminating, the like, or a combination thereof. In some alternative embodiments, the dielectric material 110 includes a plurality of dielectric layers and a plurality of etch stop layers under the dielectric layers respectively.

The conductive patterns 112 are disposed in the dielectric material 110 and electrically connected with each other. In some embodiments, the conductive patterns 112 are disposed over and electrically connected to the device 104. In some embodiments, the conductive patterns 112 include conductive lines and conductive vias. The conductive vias are formed between and in contact with two conductive lines. In addition, the conductive patterns further include contacts, and the contacts are formed between and in contact with the device layer and a bottommost conductive pattern. The conductive patterns 112 may include tungsten, copper, a copper alloy, aluminum, an aluminum alloy or a combination thereof. The conductive patterns 112 may be formed by a dual damascene process or multiple single damascene processes. In some alternative embodiments, the conductive patterns 112 is formed by an electroplating process.

Figure 1B:
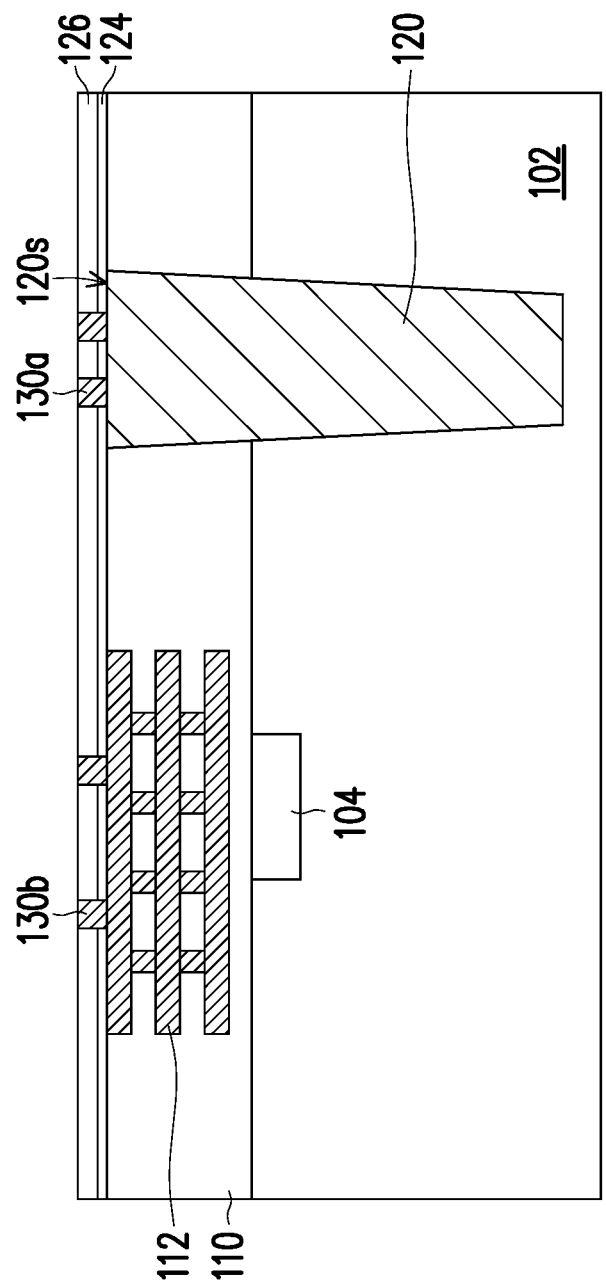

Referring to FIG. 1B, a through via 120 is formed in the dielectric material 110 and the substrate 102. In some embodiments, the through via 120 is also called "a through silicon via" when the substrate 102 is a silicon-containing substrate. In some embodiments, the through via 120 includes a conductive via. The conductive via includes copper, a copper alloy, aluminum, an aluminum alloy or a combination thereof. In some embodiments, the through via 120 further includes a diffusion barrier layer between the conductive via and the substrate 102. The diffusion barrier layer includes Ta, TaN, Ti, TiN, CoW or a combination thereof. In some embodiments, the through via 120 penetrates the dielectric material 110 and is extended into the substrate 102. In some embodiments, a sidewall of the through via 120 is in direct contact with the dielectric material 110 and the substrate 102. In some alternative embodiments, the through via 120 is also referred to as a "through substrate via". For example, the through via 120 penetrates the substrate 102, in other words, the through via 120 is extended between two opposite surfaces of the substrate 102.

In some embodiments, the through via 120 has an exposed surface (i.e., top surface) 120s confining by a periphery 122 (also referred to as an edge (a boundary)). From a top view, as shown in FIG. 2, the through via 120 may be circular. However, the disclosure is not limited thereto. In some alternative embodiments, the through via 120 has any other suitable shape. In some embodiments, a total area of the surface 120s is in a range of about 0.04 um to about 25 um, for example.

Then, a dielectric layer 126 and a plurality of conductive vias 130a, 130b are formed over the conductive patterns 112 and the through via 120. In some embodiments, an etch stop layer 124 is formed under the dielectric layer 126. In some embodiments, the dielectric layer 126 is formed on the etch stop layer 124 over the dielectric material 110, the conductive patterns 112 and the through via 120. The conductive vias 130a, 130b are formed in the etch stop layer 124 and the dielectric layer 126 to electrically connect to the through via 120 and the conductive patterns 112 respectively. The conductive vias 130a, 130b may include tungsten, copper, a copper alloy, aluminum, an aluminum alloy or a combination thereof. The conductive vias 130a, 130b may be formed by a dual damascene process or multiple single damascene processes. A shape of the conductive vias 130a, 130b may be a cylinder, a bar or any other suitable shape. In some embodiments, as shown in FIG. 2, from a top view, the conductive vias 130a is circular. However, the disclosure is not limited thereto. In some alternative embodiments, the conductive vias 130a, 130b have any other suitable shape. The conductive vias 130a and the conductive vias 130b are formed simultaneously or separately. In some embodiments, top surfaces of the conductive vias 130a are substantially flush with top surfaces of the conductive vias 130b.

Figure 1C:
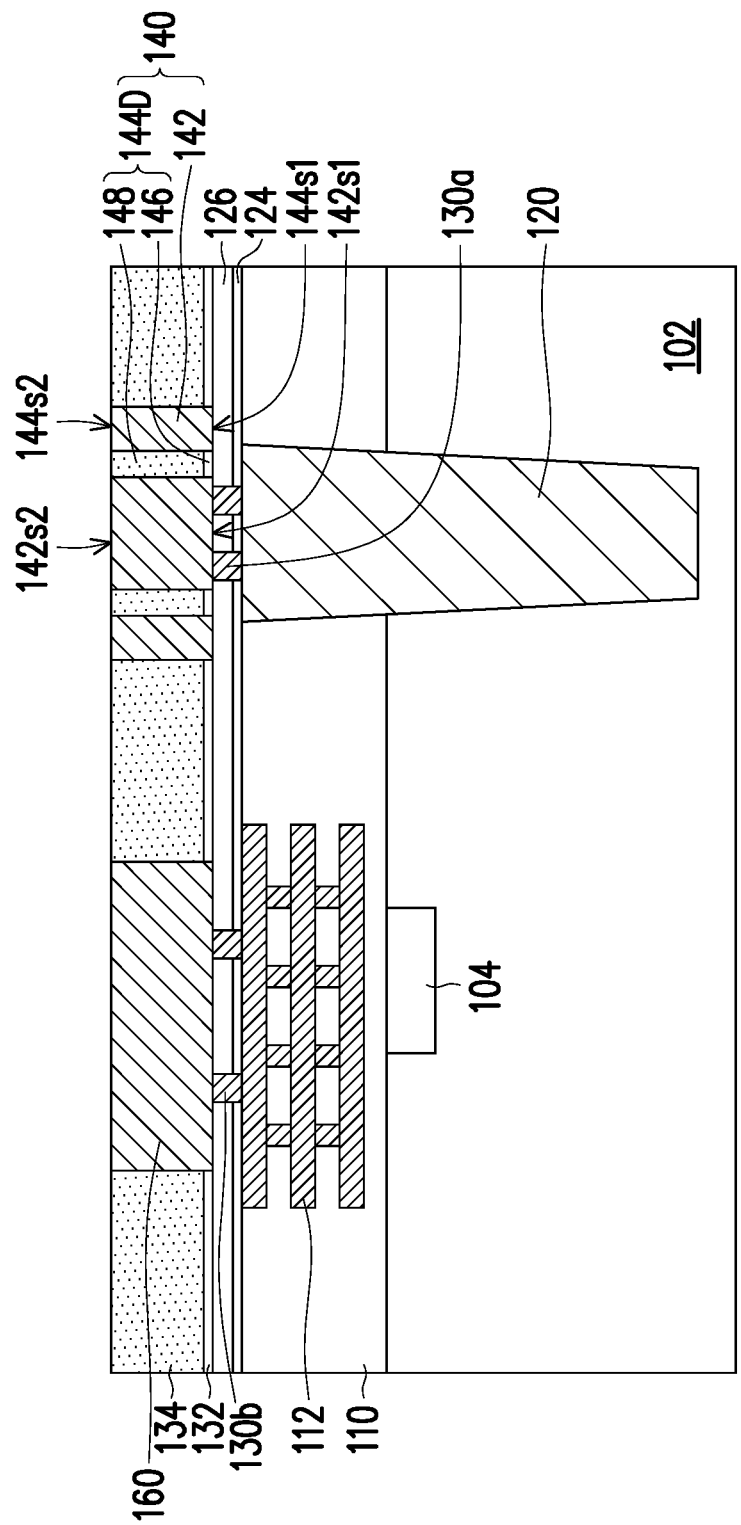

Referring to FIG. 1C, a conductive pad 140 is formed over the through via 120 to electrically connect to the through via 120. In some embodiments, a conductive pattern 160 is formed over the conductive patterns 112 to electrically connect to the conductive patterns 112. The conductive pattern 160 may be a conductive layer, a conductive pad or a conductive line. In some embodiments, the conductive pad 140 and the conductive pattern 160 are formed simultaneously. For example, an etch stop layer 132 and a dielectric layer 134 are sequentially formed over the dielectric layer 126. Then, by using a mask, the etch stop layer 132 and the dielectric layer 134 are patterned. For example, portions of the etch stop layer 132 and the dielectric layer 134 are removed to form a plurality of openings (not shown), so as to expose the conductive vias 130a, 130b respectively. The opening over and exposing the conductive vias 130a has a profile corresponding to a profile of the conductive pad 140, and the opening over and exposing the conductive vias 130b has a profile corresponding to a profile of the conductive pattern 160. After that, a conductive material (not shown) is formed over the dielectric layer 134 to fill the openings and the conductive material outside the openings are removed, so as to form the conductive pad 140 and the conductive pattern 160 respectively. The conductive material (the conductive pad 140 and the conductive pattern 160) may include copper, silver, gold, tungsten, aluminum, combinations thereof, or the like. The conductive material may be formed by sputtering, printing, electro plating, electroless plating or CVD. The conductive material outside the openings may be removed by a planarization process such as chemical mechanical planarization (CMP) process. In some alternative embodiments, the conductive pad 140 and the conductive pattern 160 are formed separately.

In some embodiments, as shown in FIG. 1C and FIG. 2, the conductive pad 140 has a conductive main body 142 and a plurality of dielectric patterns 144D penetrating the conductive main body 142. In some embodiments, the conductive main body 142 is a conductive portion of the conductive pad 140 which is formed by filling the conductive material in the opening as mentioned above. Therefore, a material of the conductive main body 142 is the same as the conductive material such as copper, silver, gold, tungsten, aluminum or combinations thereof. The conductive main body 142 is integrally formed, for example. The conductive main body 142 covers the conductive vias 130a to electrically connect the conductive vias 130a. In some embodiments, the dielectric patterns 144D are dielectric portions of the conductive pad 140 which are formed by patterning the etch stop layer 132 and the dielectric layer 134 as mentioned above. The dielectric patterns 144D are separated from each other, for example. In some embodiments, the dielectric patterns 144D respectively include a first dielectric pattern 146 and a second dielectric pattern 148 on the first dielectric pattern 146. A material of the first dielectric pattern 146 is different from a material of the second dielectric pattern 148. In some embodiments, the material of the first dielectric pattern 146 is the same as the etch stop layer 132, and the material of the second dielectric pattern 148 is the same as the dielectric layer 134. A sidewall of the first dielectric pattern 146 is substantially flush with a sidewall of the second dielectric pattern 148. In some alternative embodiments, the first dielectric pattern 146 is omitted when the etch stop layer 132 under the dielectric layer 134 is omitted. In such embodiment, a material of the dielectric patterns 144D is the same as a material of the dielectric layer 134. In some embodiments, a bottom surface 142s1 (i.e., a surface facing the through via 120) of the conductive main body 142 is substantially flush with bottom surfaces 144s1 (i.e., surfaces facing the through via 120) of the dielectric patterns 144D. In some embodiments, a top surface 142s2 opposite to the bottom surface 142s1 of the conductive main body 142 is substantially flush with top surfaces 144s2 opposite to the bottom surfaces 142s1 of the dielectric patterns 144D. In addition, the top surface 144s1 of the conductive main body 142 is substantially and entirely flush with a top surface of the conductive pattern 160. However, the disclosure is not limited thereto.

From a top view, the conductive pad 140 is rectangular, for example. In some embodiments, a width of the conductive pad 140 is in a range of about 0.1 um to about 5 um, and a thickness of the conductive pad 140 is in a range of about 0.1 um to about 5 um. The dielectric patterns 144D may have a variety of shapes such as rectangle, square, ellipse, C shape or any other suitable shape. The dielectric patterns 144D may be disposed at opposite sides of the conductive vias 130a. In some embodiments, the conductive vias 130a are surrounded by the dielectric patterns 144D. The dielectric patterns 144D may be symmetrically arranged with respect to the conductive vias 130a.

In some embodiments, the conductive pad 140 is disposed on and covers the through via 120. The conductive pad 140 has a region 150 corresponding to the through via 120. That is, a projection of the region 150 of the conductive pad 140 onto the substrate 102 may be substantially the same as and entirely overlapped with a projection of the through via 120 (i.e., a projection of the surface 120s of the through via 120) onto the substrate 102. The region 150 has a periphery 152, and a projection of the periphery 152 of the region 150 onto the substrate 102 is substantially entirely overlapped with a projection of the periphery 122 of the through via 120 onto the substrate 102. In some embodiments, the dielectric patterns 144D are disposed within the region 150. The dielectric patterns 144D may be arranged along the periphery 152 of the region 150. In some embodiments, some dielectric patterns 144D (e.g., inner dielectric patterns 144D2) are disposed between the dielectric patterns 144D (e.g., outer dielectric patterns 144D1) and the conductive vias 130a. In some embodiments, a shortest distance d1 between the dielectric pattern 144D (e.g., outer dielectric patterns 144D1) and the periphery 152 of the region 150 is larger than 0.5 μm. In some embodiments, a shortest distance d2 between a periphery 141 of the conductive pad 140 and the periphery 152 of the region 150 is larger than 0.5 μm. In some embodiments, an outline (or a profile) 145 of the dielectric pattern 144D (e.g., outer dielectric patterns 144D1) is partially conformal with the periphery 152 of the region 150. However, the disclosure is not limited thereto. In some embodiments, the conductor density (e.g., the conductor content or the metal density) of the conductive pad 140 within the region 150 is in a range of about 40% to about 80%. For example, a content of the conductive portion (i.e., a portion of the conductive main body 142) within the region 150 is in a range of about 40% to about 80%. In some embodiments, from a top view, the conductive main body 142 within the region 150 has a first area, the region 150 has a second area, and a ration of the first area to the second area is in a range of about 40% to about 80%. Conventionally, a peeling may occur between the through via and the dielectric material surrounding the through via due to a peel stress. In some embodiments, by forming the dielectric patterns 144D in the conductive pad 140, a reduction of peel stress is in a range of about 20% to about 40%.

Figure 3:
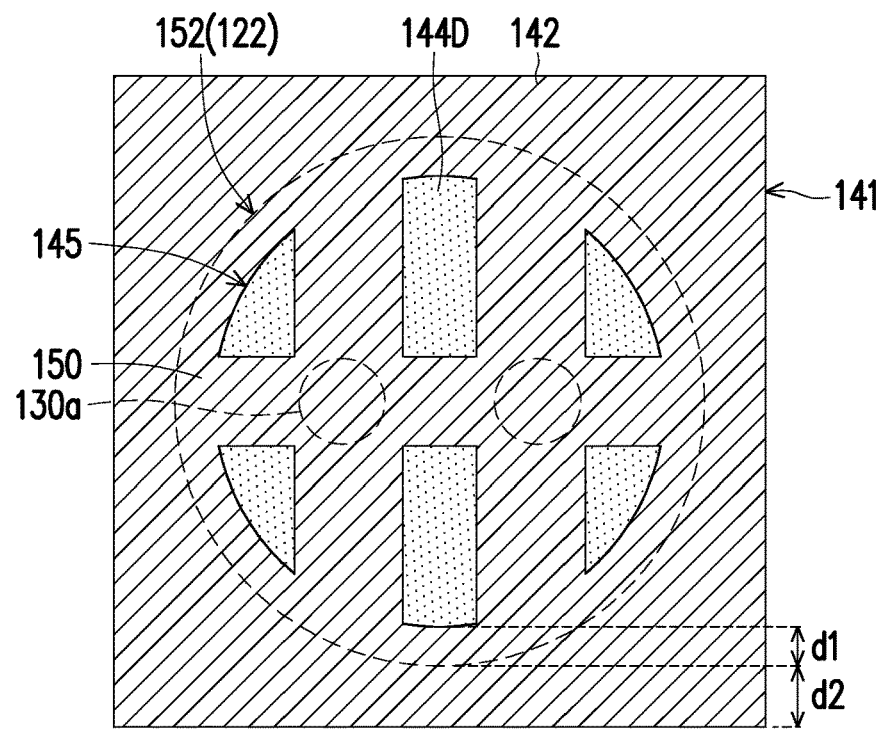
FIG. 3 is a top view of a conductive pad of an integrated circuit.
Figure 4:
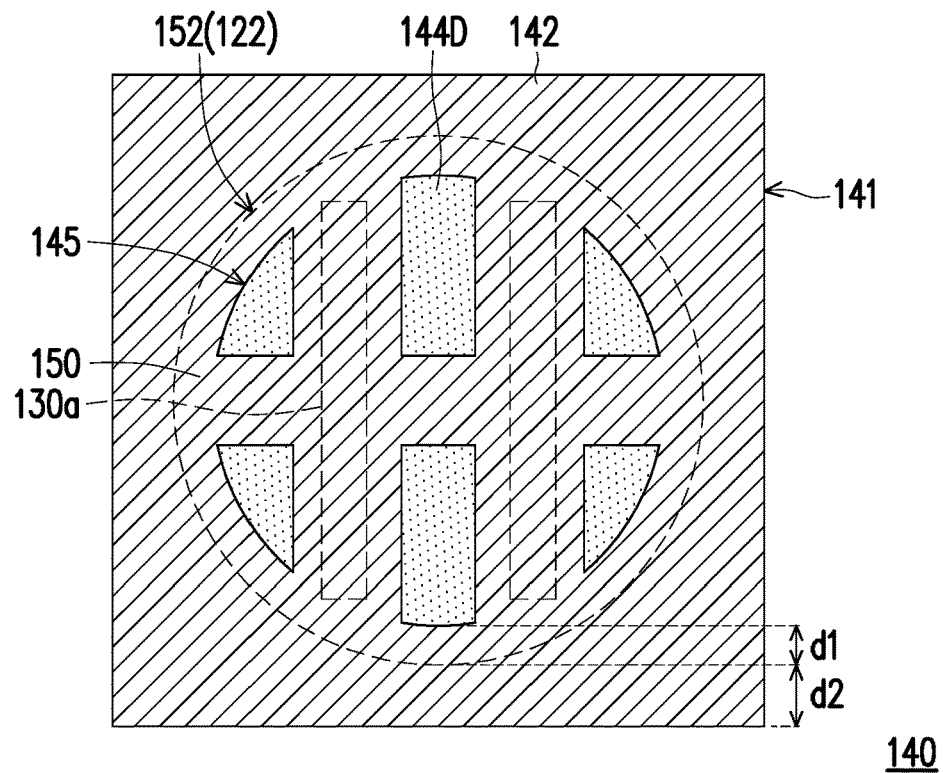
FIG. 4 is a top view of a conductive pad of an integrated circuit.

In some embodiments, the dielectric patterns 144D have configurations of FIG. 2. However, the disclosure is not limited thereto. In some alternative embodiments, the dielectric patterns 144D have any other suitable configurations. For example, the dielectric patterns 144D have configurations of FIG. 3. In such embodiments, the dielectric patterns 144D surround the conductive vias 130a, and an outline 145 of the dielectric pattern 144D is partially conformal with the periphery 152 of the region 150. In addition, the conductive vias 130a may have other configurations. For example, as shown in FIG. 4, the conductive vias 130a are bar-shaped. The bar-shaped conductive vias 130a may be extended between the dielectric pattern 144D.

Figure 5:
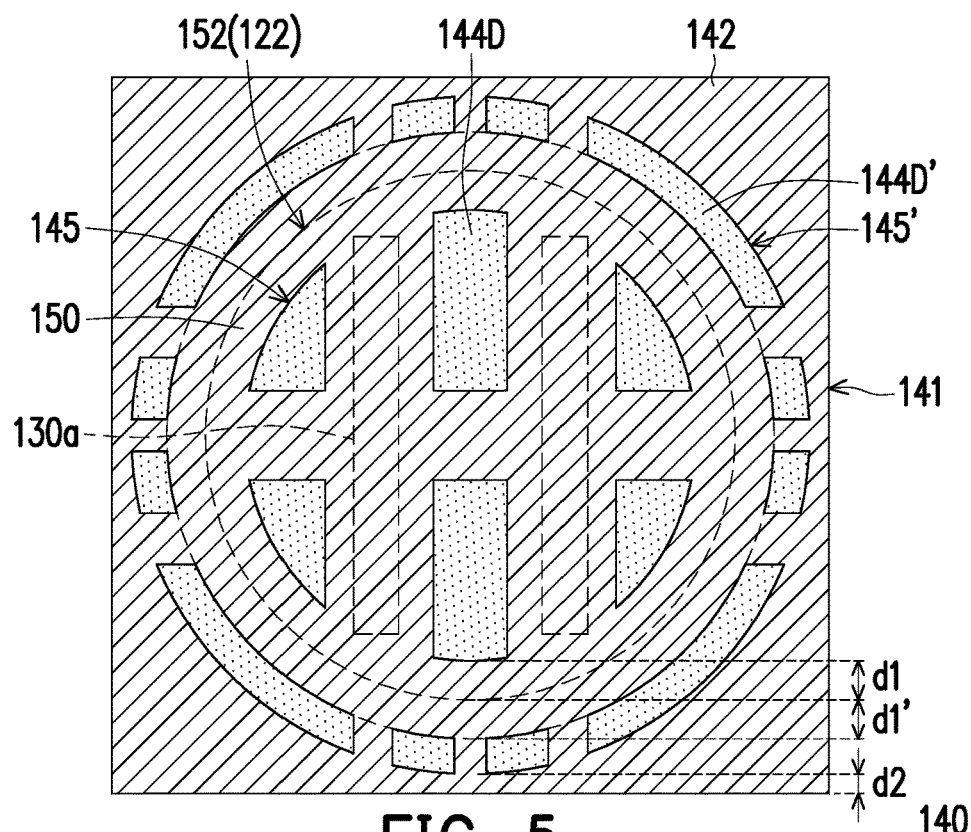
FIG. 5 is a top view of a conductive pad of an integrated circuit.

In above embodiments, the dielectric patterns 144D are disposed within the region 150 of the conductive pad 140. However, the disclosure is not limited thereto. In some alternative embodiments, as shown in FIG. 5, some dielectric patterns 144D' (additional dielectric patterns) are disposed outside the region 150. The dielectric patterns 144D' may be arranged along the periphery 152 of the region 150. An outline (or a profile) 145' of the dielectric pattern 144D' may be partially conformal with the periphery 152 of the region 150. A shortest distance d1 between the dielectric pattern 144D and the periphery 152 of the region 150 is larger than 0.5 μm, for example. A shortest distance d1' between the dielectric pattern 144D' and the periphery 152 of the region 150 is larger than 0.5 μm, for example. In some embodiments, portions of the conductive pad 140 between the dielectric pattern 144D' serve as conductive line bridges.

Figure 1D:
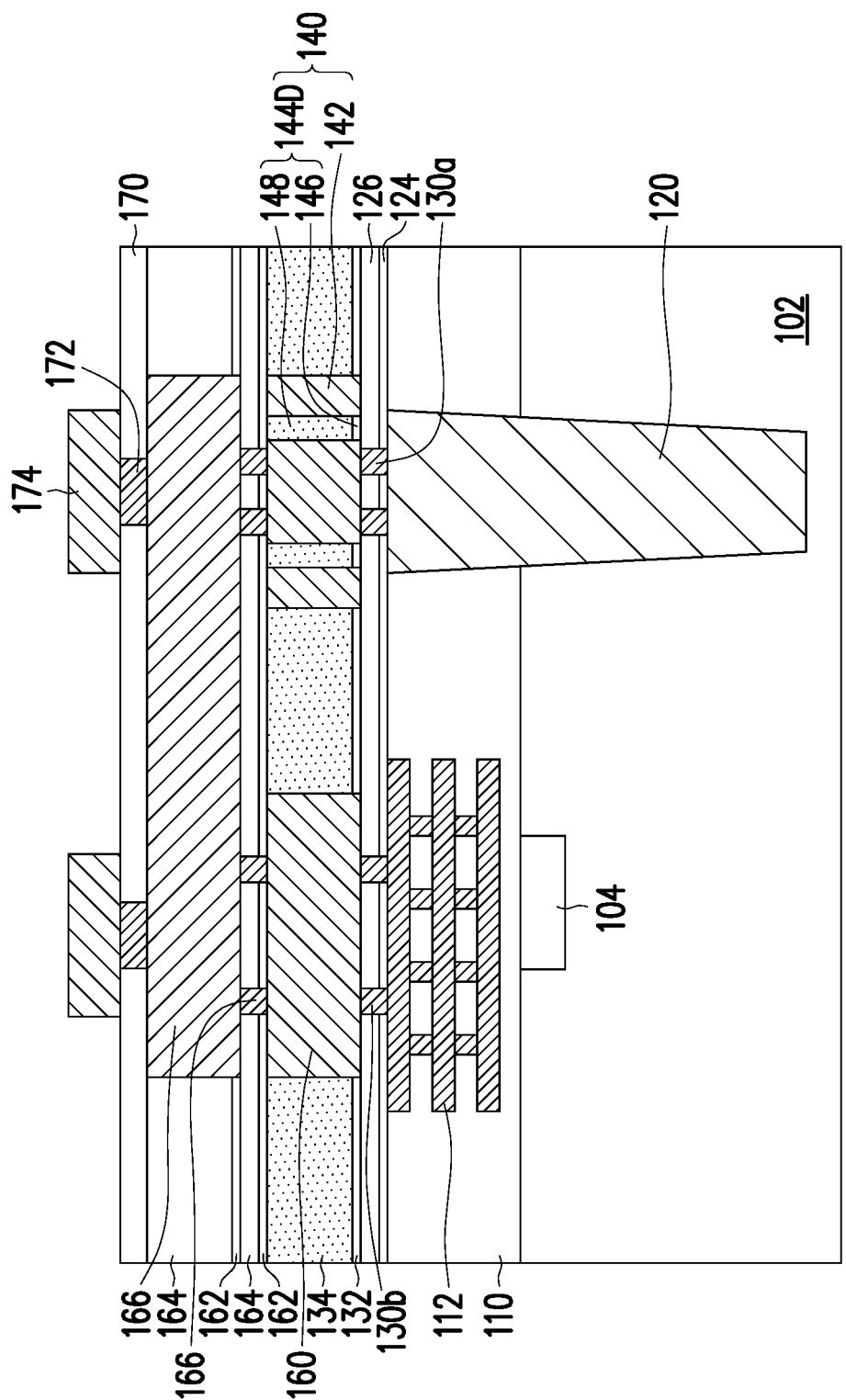

Referring to FIG. 1D, a plurality of dielectric layers 164 and a plurality of conductive patterns 166 are formed over the conductive pad 140 and the conductive pattern 160. The dielectric layers 164 are stacked on one another over the dielectric layer 134. In some embodiments, the dielectric layers 164 are also referred to as inter-metal dielectric (IMD) layers. In some embodiments, a plurality of etch stop layers 162 are formed under the dielectric layers respectively. The conductive patterns 166 are disposed in the etch stop layers 162 and the dielectric layers 164, and the conductive patterns 166 are electrically connected to the conductive pad 140 and the conductive pattern 160. In some embodiments, the conductive pad 140 and the conductive pattern 160 are electrically connected to the same conductive pattern 166. However, the disclosure is not limited thereto. In some alternative embodiments, the conductive pad 140 and the conductive pattern 160 are electrically connected to different conductive pattern 166. The conductive patterns 166 include conductive lines and conductive vias. The conductive vias are formed between and in contact with two conductive lines. A material and a forming method of the dielectric layers 164 may be similar to the dielectric material 110. A material and a forming method of the conductive patterns 166 may be similar to the conductive patterns 112. In some embodiments, the conductive patterns 112, the conductive pattern 160 and the conductive patterns 166 are collectively referred to as an interconnect structure 168. However, the disclosure is not limited herein. In other words, the interconnect structure 168 may have any other suitable configuration. For example, the interconnect structure 168 includes more layers of the conductive patterns 166, and/or the conductive pad 140 and the conductive pattern 160 are electrically connected to different conductive patterns 166.

Then, a plurality of conductive pads 174 are formed over the interconnect structure 168 to electrically connect to the interconnect structure 168. For example, a plurality of conductive vias 172 are formed in a dielectric layer 170 (also referred to as a passivation layer) over the dielectric layer 164, and a plurality of conductive pads 174 are formed on the dielectric layer 170. The conductive vias 172 are disposed on and electrically connected to the topmost conductive pattern 166 of the interconnect structure 168, the conductive pads 174 are disposed on and electrically connected to the conductive vias 172. The conductive pads 174 may serve as test pads. In some embodiments, the conductive pads 174 are aluminum pads. However, the disclosure is not limited thereto. In some alternative embodiments, the conductive via 172 and the conductive pad 174 are integrally formed.

Figure 1E:
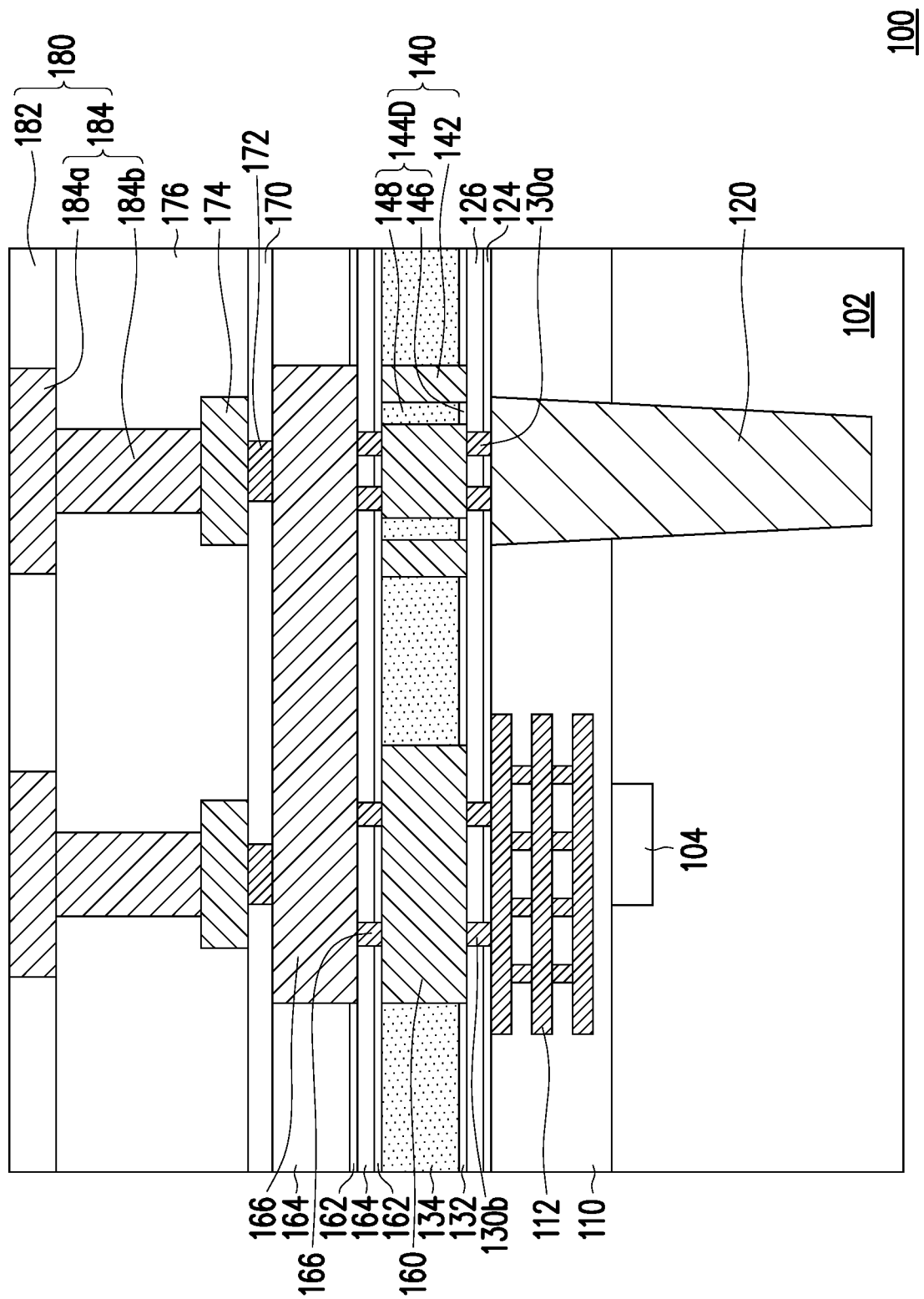

Referring to FIG. 1E, a bonding structure 180 is formed over the conductive pads 174. In some embodiments, the bonding structure 180 includes at least one bonding dielectric layer 182 and at least one bonding conductive pattern such as a bonding pad 184a and/or a bonding via 184b. In some embodiments, a dielectric layer 176 is formed over the conductive pads 174 to cover the conductive pads 174. The bonding via 184b is formed in the dielectric layer 176 to electrically connect to the conductive pad 174. The bonding dielectric layer 182 is formed over the dielectric layer 176, and the bonding pad 184a is formed in the bonding dielectric layer 182 and are electrically connected to the bonding via 184b. n some embodiments, the dielectric layer 176 includes silicon oxide, silicon nitride, a polymer or a combination thereof. In some embodiments, the bonding dielectric layer 182 includes silicon oxide, silicon nitride, a polymer or a combination thereof. The bonding conductive pattern may include tungsten, copper, a copper alloy, aluminum, an aluminum alloy or a combination thereof. In some embodiments, a barrier layer may be disposed between the bonding conductive pattern and the bonding dielectric layer 182. The barrier layer includes Ta, TaN, Ti, TiN, CoW or a combination thereof, for example. In some embodiments, the bonding structure 180 is formed by multiple single damascene processes. In some alternative embodiments, the bonding structure 180 is formed by a dual damascene process. In some alternative embodiments, the bonding structure 180 is formed by an electroplating process. In some embodiments, the bonding structure 180 is physically and electrically connected to the conductive pad 174. Specifically, the bonding via 184b of the bonding structure 180 is in contact with the conductive pad 174, and the bonding via 184b is disposed between the bonding pad 184a and the conductive pad 174. In some alternative embodiments, the bonding structure 180 is physically and electrically connected to the conductive patterns 166 of the interconnect structure 168.

After forming the bonding structure 180, an integrated circuit 100 is formed. The integrated circuit 100 may be a wafer or a die. The die may be an application-specific integrated circuit (ASIC) chip, an analog chip, a sensor chip, a wireless and radio frequency chip, a voltage regulator chip or a memory chip, for example. In some embodiments, the integrated circuit 100 may be an active component or a passive component.

In some embodiments, the conductive pad 140 includes a plurality of dielectric patterns 144D therein, and thus the conductor density of the conductive pad 140 directly over the through via 120 is reduced. Accordingly, the peel stress causing the through via peeling from the dielectric layer therearound is relieved.

Figure 6A:
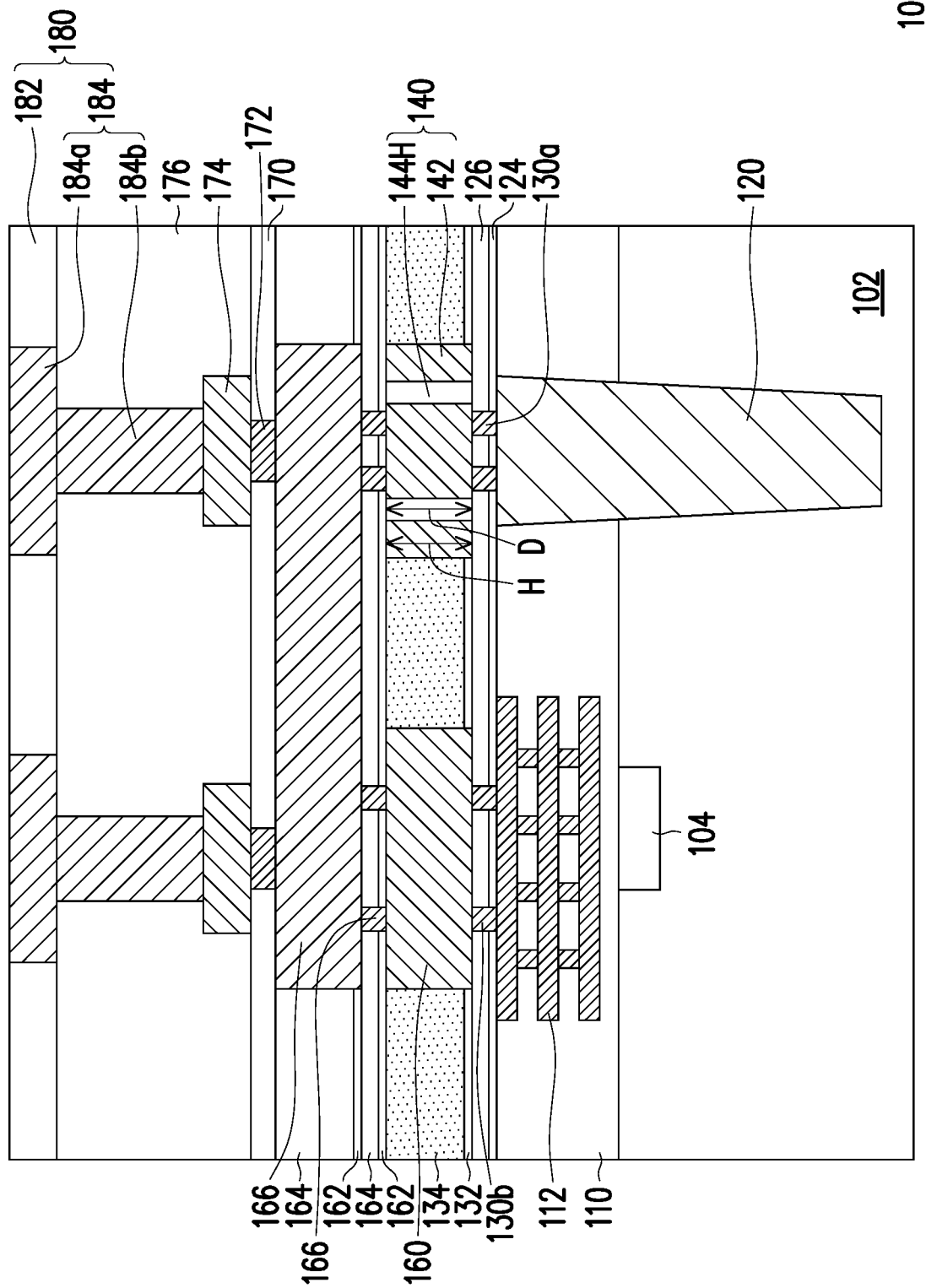
FIG. 6A illustrates a cross-sectional view of an integrated circuit in accordance with some embodiments.
Figure 6B:
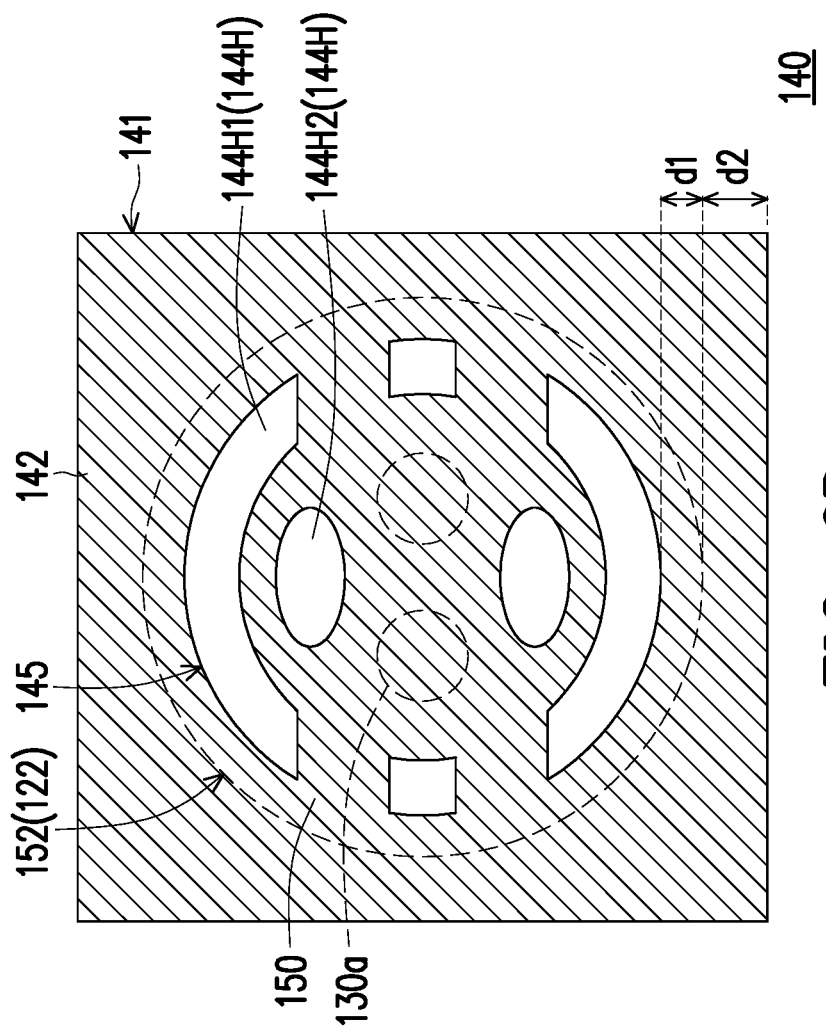
FIG. 6B is a top view of a conductive pad of the integrated circuit of FIG. 6A.

FIG. 6A illustrates a cross-sectional view of an integrated circuit in accordance with some embodiments, and FIG. 6B is a top view of a conductive pad of the integrated circuit of FIG. 6A. The integrated circuit 100 of FIG. 6A is similar to the integrated circuit 100 of FIG. 1E, and the main difference lies in a structure of a conductive pad 140. Referring to FIG. 6A and FIG. 6B, in some embodiments, the conductive pad 140 includes a conductive main body 142 and a plurality of holes (also referred to as voids) 144H. In some embodiments, the conductive pad 140 is formed by forming an opening in an etch stop layer 132 and a dielectric layer 134 to expose vias 130a, forming a conductive pattern (not shown) filling the opening to electrically connect to the conductive vias 130a and forming a plurality of holes 144H in the conductive pattern by removing portions of the conductive pattern. In some embodiments, the conductive main body 142 is the remaining portion of the conductive pattern. The holes 144H may be formed by patterning, drilling or any other suitable process. The holes 144H may have a variety of shapes such as rectangle, square, ellipse, C shape or any other suitable shape. The holes 144H may be disposed at opposite sides of the conductive vias 130a. In some embodiments, the conductive vias 130a are surrounded by the holes 144H. The holes 144H may be symmetrically arranged with respect to the conductive vias 130a.

In some embodiments, the conductive pad 140 is disposed on and covers the through via 120. The conductive pad 140 has a region 150 corresponding to the through via 120. That is, a projection of the region 150 of the conductive pad 140 onto the substrate 102 may be substantially the same as and entirely overlapped with a projection of the through via 120 onto the substrate 102. In some embodiments, the holes 144H are disposed within the region 150. The holes 144H may be arranged along a periphery 152 of the region 150. In some embodiments, a shortest distance d1 between the hole 144H and the periphery 152 of the region 150 is larger than 0.5 μm. In some embodiments, some holes 144H (e.g., inner holes 144H2) are disposed between the holes 144H (e.g., outer holes 144H1) and the conductive vias 130a. In some embodiments, a shortest distance d1 between the holes 144H (e.g., outer holes 144H1) and the periphery 152 of the region 150 is larger than 0.5 µm. In some embodiments, a shortest distance d2 between a periphery 141 of the conductive pad 140 and the periphery 152 of the region 150 is larger than 0.5 µm. In some embodiments, an outline 145 of the hole 144H (e.g., outer holes 144H1) is partially conformal with the periphery 152 of the region 150. However, the disclosure is not limited thereto. In some embodiments, the conductor density (e.g., the conductor content or the metal density) of the conductive pad 140 within the region 150 is in a range of about 40% to about 80%. For example, a content of the conductive portion (i.e., a portion of the conductive main body 142) within the region 150 is in a range of about 40% to about 80%. In some embodiments, from a top view, the conductive main body 142 within the region 150 has a first area, the region 150 has a second area, and a ration of the first area to the second area is in a range of about 40% to about 80%. Conventionally, a peeling may occur between the through via and the dielectric layer surrounding the through via due to a peel stress. In some embodiments, by forming the holes 144H in the conductive pad 140 to reduce the conductor density of the conductive pad 140 directly over the through via 120, a peel stress is reduced. In some alternative embodiments, the holes 144H have any other suitable configurations. For example, the holes 144H have shapes substantially the same as or similar to shapes of the dielectric patterns 144D of FIG. 3 or FIG. 5. In some embodiments, some holes 144H may be disposed outside the region 150 and arranged along the periphery 152 of the region 150.

Figure 7:
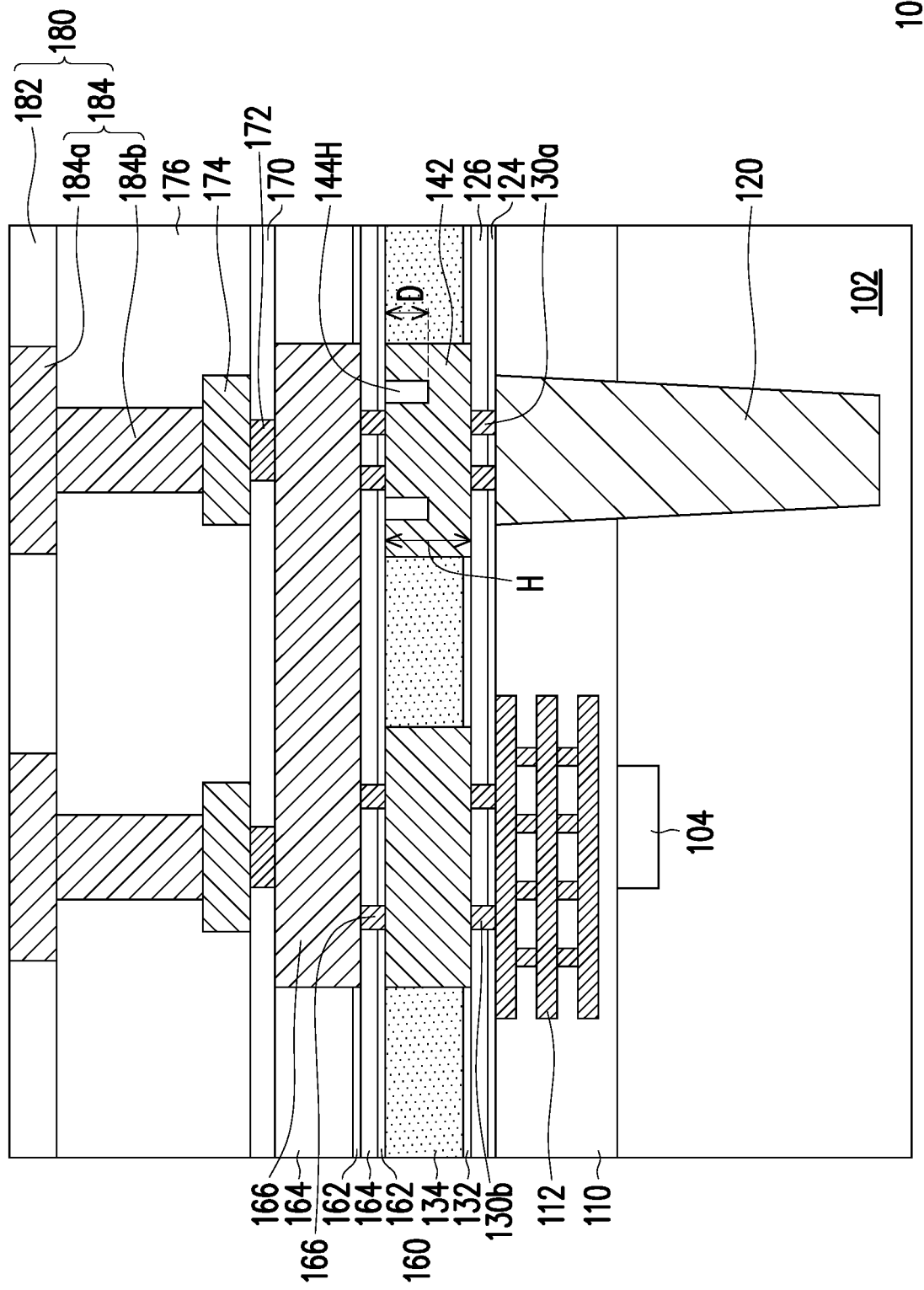
FIG. 7 is a top view of a conductive pad of an integrated circuit.
Figure 8:
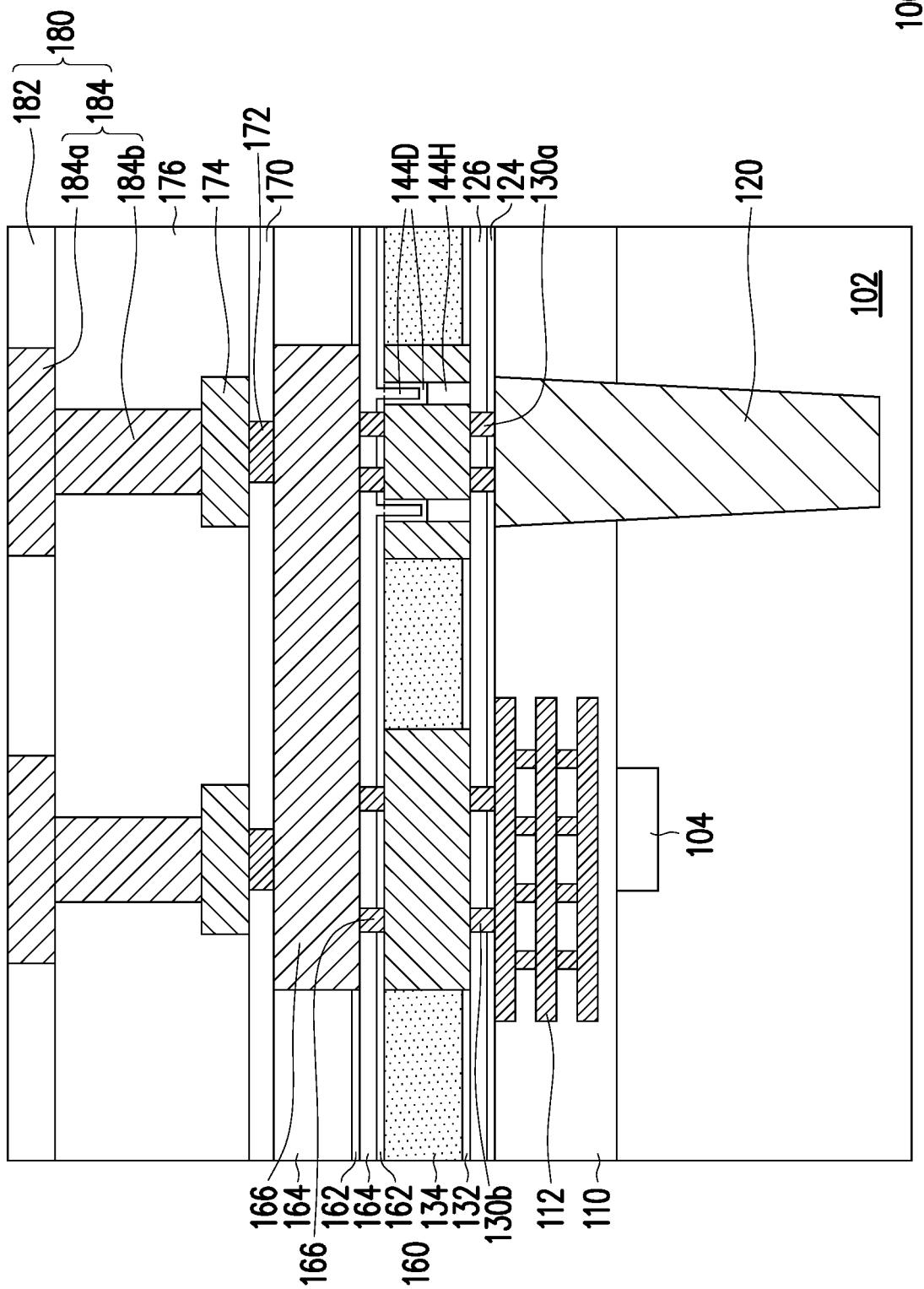
FIG. 8 is a top view of a conductive pad of an integrated circuit.

In some embodiments, the holes 144H penetrate through the conductive main body 142, and thus the holes 144H have a depth D substantially the same as a height (i.e., the largest height) H of the conductive main body 142. Accordingly, the holes 144H may expose portions of a dielectric layer 126 under the etch stop layer 132. However, the disclosure is not limited thereto. In some alternative embodiments, as shown in FIG. 7, the holes 144H have a depth D smaller than a height H of the conductive main body 142. That is, the holes 144H do not penetrate the conductive main body 142, and portions of the conductive main body 142 are disposed below the holes 144H. Accordingly, the holes 144H expose portions of the conductive main body 142. In some embodiments, after forming the etch stop layer 162 and the dielectric layer 164, the holes 144H of FIG. 6A to FIG. 7 are not or substantially not filled by a material of the etch stop layer 162 or materials of the etch stop layer 162 and the dielectric layer 164. However, the disclosure is not limited thereto. In some alternative embodiments, according to widths and depths of the holes 144H and/or thicknesses of the etch stop layer 162 and the dielectric layer 164, the holes 144H are at least partially filled by at least one of the materials of the etch stop layer 162 and the dielectric layer 164. For example, as shown in FIG. 8, the holes 144H are partially filled by the materials of the etch stop layer 162 and the dielectric layer 164. In such embodiments, the conductive pad 140 has both dielectric patterns 144D and the holes 144H in the conductive main body 142. In some alternative embodiments, the holes 144H are fully filled by the materials of the etch stop layer 162 and the dielectric layer 164. In such embodiments, there is no holes in the conductive main body 142. Similarly, in some alternative embodiments, the holes 144H of FIG. 7 are partially or fully filled by the materials of the etch stop layer 162 and the dielectric layer 164. In above embodiments, the dielectric patterns 144D are integrally formed with the etch stop layer 162 and the dielectric layer 164. In other words, materials of the dielectric patterns 144D are the same as the materials of the etch stop layer 162 and the dielectric layer 164. However, the disclosure is not limited thereto. The holes 144H may be partially or fully filled by the material of the etch stop layer 162. In some embodiments, the holes 144H are sealed by the material of the etch stop layer 162, or the material of the etch stop layer 162 is disposed on a sidewall of the holes 144H without filling the holes 144H. Moreover, in some embodiments in which the etch stop layer 162 is omitted, the holes 144H are partially or fully filled or sealed by the material of the dielectric layer 164. It is noted that although bottom surfaces of the dielectric patterns 144D are illustrated as being flush with one another, the disclosure is not limited thereto. The bottom surfaces of the dielectric patterns 144D may be not flush with each other.

In some alternative embodiments, after forming the holes 144H and before forming the etch stop layer 162 and the dielectric layer 164, a dielectric pattern 144D is formed in the hole 144H to partially or fully fill the hole 144H. That is, the dielectric pattern 144D may be not integrally formed with the etch stop layer 162 or the dielectric layer 164. A material of the dielectric pattern 144D may be different from or the same as the materials of the etch stop layer 162 and the dielectric layer 164. The dielectric pattern 144D may have a single layer structure or multiple layer structure. In some embodiments, tops of the dielectric patterns 144D are not flush with each other. In some alternative embodiments, the tops of the dielectric patterns 144D are flush with each other. Similarly, bottoms of the dielectric patterns 144D may be flush with or not flush with each other.

Figure 9:
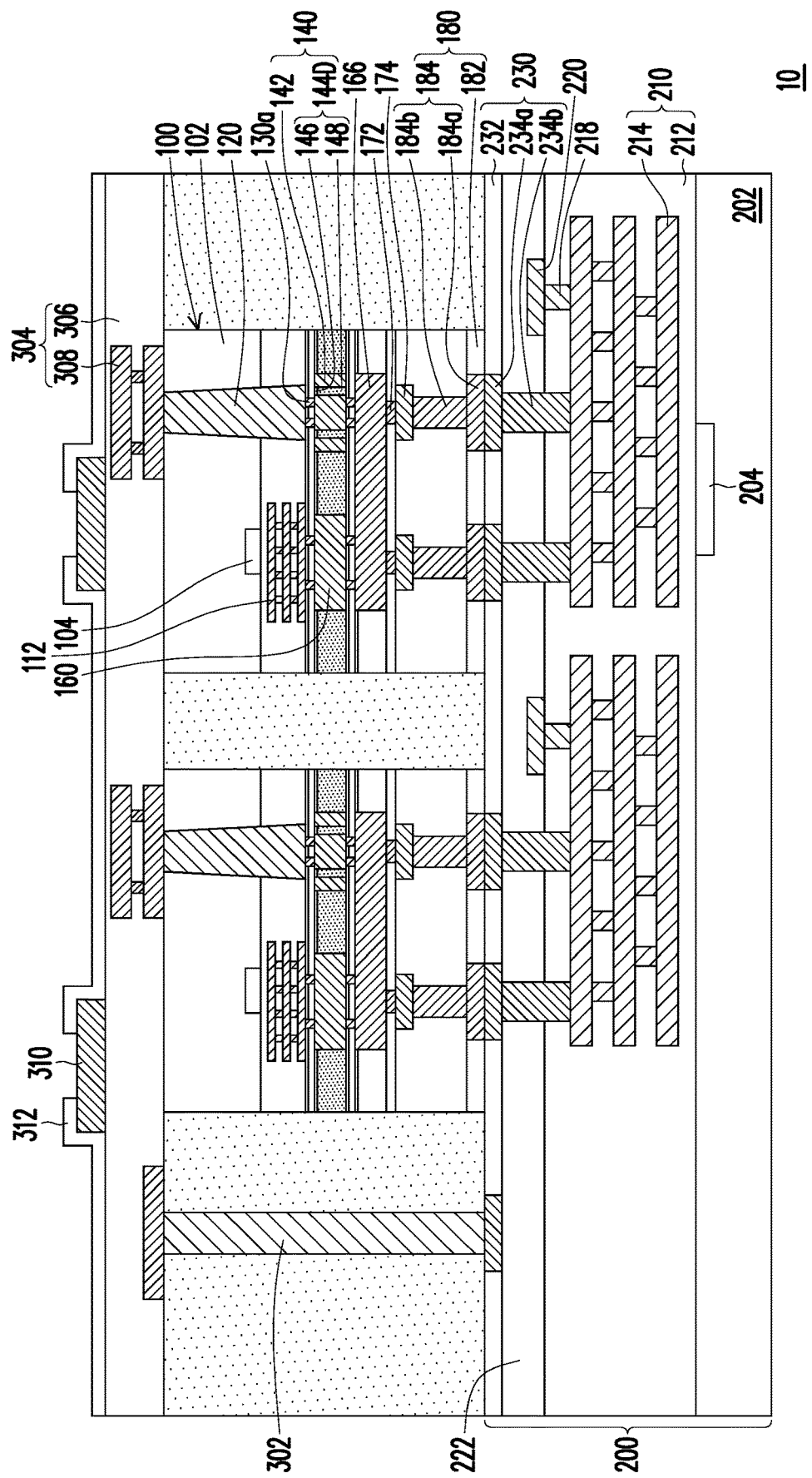
FIG. 9 illustrates a cross-sectional view of a semiconductor device in accordance with some embodiments.

FIG. 9 illustrates a cross-sectional view of a semiconductor device in accordance with some embodiments. Referring to FIG. 9, in some embodiments, a semiconductor device 10 includes a plurality of integrated circuits 100 and an integrated circuit 200. The integrated circuit 100 may be substantially the same as or similar to any one of the integrated circuits 100 described above. The integrated circuits 100 are bonded to the integrated circuit 200. The integrated circuit 200 may be an application-specific integrated circuit (ASIC) chip, an analog chip, a sensor chip, a wireless and radio frequency chip, a voltage regulator chip or a memory chip, for example. The integrated circuit 200 and the integrated circuit 100 may be the same type of dies or different types of dies. In some embodiments, the integrated circuit 200 is an active component or a passive component. In some embodiments, the integrated circuit 200 is larger than a total area of the integrated circuit 100. The integrated circuit 200 may be also referred to as a base die. In some embodiments, the size of the integrated circuit 200 is smaller than the size of the integrated circuit 100. Herein, the term "size" is referred to the length, width and/or area. In addition, one integrated circuit 100 is illustrated, however, there may be more integrated circuits over the integrated circuit 200.

In some embodiments, the integrated circuit 200 includes a substrate 202, an interconnect structure 210 and a plurality of bonding structures 230. In some embodiments, the substrate 202 includes isolation structures defining at least one active area, and a device layer is disposed on/in the active area. The device layer includes at least one device 204. In some embodiments, the device 204 includes an active component, a passive component, or a combination thereof. In some embodiments, the device 204 include an integrated circuits device. The device 204 is, for example, a transistor, a capacitor, a resistor, a diode, a photodiode, a fuse device, or other similar device. In some embodiments, the device layer includes a gate structure, source/drain regions, spacers, and the like.

The interconnect structure 210 is disposed over a surface (e.g., front surface) of the substrate 202. Specifically, the interconnect structure 210 is disposed over and electrically connected to the device layer. In some embodiments, the interconnect structure 210 includes at least one dielectric layer 212 and a plurality of conductive patterns 214. The conductive patterns 214 are disposed in the dielectric layer 212 and electrically connected with each other.

In some embodiments, a conductive pad 220 is formed over the interconnect structure 210 to electrically connect to the interconnect structure 210. For example, a via 218 is formed between the conductive pad 220 and the conductive pattern 214 of the interconnect structure 210 to electrically connect the conductive pad 220 and the interconnect structure 210. In some embodiments, the conductive pad 220 is an aluminum pad, for example. However, the disclosure is not limited thereto.

The bonding structure 230 is similar to the bonding structure 180. The bonding structure 230 is disposed over the surface (e.g., front surface) of the interconnect structure 210. In some embodiments, the bonding structure 230 is disposed in at least one bonding dielectric layer 232 and includes a bonding conductive pattern such as a bonding pad 234a and/or a bonding via 234b. The bonding via 234b is electrically connected to the interconnect structure 210, and the bonding pad 234a is electrically connected to the bonding via 234b. In some embodiments, a dielectric layer 222 is formed over the conductive pad 220 to cover the conductive pad 220. The bonding via 234b is formed in the dielectric layers 212, 222 to electrically connect to the interconnect structure 210.

In some embodiments, the integrated circuits 100 and the integrated circuit 200 are face-to-face bonded together with the bonding structures 180 and the bonding structures 230. In some embodiments, before the integrated circuits 100 are bonded to the integrated circuit 200, the bonding structures 180 and the bonding structures 230 are aligned, such that the bonding pads 184a are bonded to the bonding pads 234a and the bonding dielectric layers 182 are bonded to the bonding dielectric layer 232. In some embodiments, the alignment of the bonding structures 180 and the bonding structures 230 may be achieved by using an optical sensing method. After the alignment is achieved, the bonding structures 180 and the bonding structures 230 are bonded together by a hybrid bonding including a metal-to-metal bonding and a dielectric-to-dielectric bonding. After the integrated circuits 100 are bonded to the integrated circuit 200, the integrated circuits 100 are electrically connected to the integrated circuit 200.

In some embodiments, a gap-filling material 300, a plurality of through dielectric vias 302, a redistribution layer structure 304, a plurality of pads 310 and a passivation layer 312 are further included in the semiconductor device 10. The gap-filling material 300 fills a gap between each two adjacent integrated circuits 100. In some embodiments, the gap-filling material 300 includes silicon oxide, silicon nitride or a combination thereof. In some alternative embodiments, the gap-filling material 300 includes a molding compound. The gap-filling material 300 may be formed by spin-coating, lamination, deposition or the like. The gap-filling material 300 surrounds the integrated circuits 100 and exposes tops of the integrated circuits 100. In some embodiments, a surface of the gap-filling material 300 is substantially coplanar with surfaces (e.g., back surfaces) of the integrated circuits 100. For example, after forming the gap-filling material 300, a planarization process is performed to remove a portion of the substrate 102, and thus the through via 120 is revealed. In some embodiments, the surfaces of the substrate 102 and the through via 120 are substantially coplanar with the surface of the gap-filling material 300.

The through dielectric vias 302 are disposed in the gap-filling material 300 and electrically connected with the interconnect structure 210 of the integrated circuit 200 and the to-be-formed redistribution layer structure 304. The through dielectric vias 302 may electrically connected to the interconnect structure 210 through the bonding pad 234a. In some embodiments, the through dielectric vias 302 include conductive vias. The conductive vias include copper, a copper alloy, aluminum, an aluminum alloy or a combination thereof. In some embodiments, the through dielectric vias 302 further include a diffusion barrier layer between the conductive vias and the gap-filling material 300. The diffusion barrier layer includes Ta, TaN, Ti, TiN, CoW or a combination thereof.

The redistribution layer structure 304 is disposed over the second side (e.g., back side) of the integrated circuits 100 and over the gap-filling material 300. The redistribution layer structure 304 includes at least one dielectric layer 306 and a plurality of conductive patterns 308 in the dielectric layer 306. In some embodiments, a portion of the redistribution layer structure 304 is electrically connected to the through dielectric vias 302. In some embodiments, another portion of the redistribution layer structure 304 is electrically connected to the through silicon vias. In some embodiments, the dielectric layer 306 includes a photo-sensitive material such as polybenzoxazole (PBO), polyimide (PI), benzocyclobutene (BCB), a combination thereof or the like. In some embodiments, the conductive patterns 308 include copper, nickel, titanium, a combination thereof or the like.

The pads 310 are disposed over and electrically connected to the redistribution layer structure 304. In some embodiments, the pads 310 are under bump metallization (UBM) pads for mounting conductive connectors, such as metal pillars, μ-bumps or the like. The pads 310 may include a metal or a metal alloy. The pads 310 may include aluminum, copper, nickel, or an alloy thereof.

The passivation layer 312 covers the dielectric layer 306 and edge portions of the pads 310, and exposes the center portions of the pads 310. In some embodiments, the passivation layer 312 includes silicon oxide, silicon nitride, benzocyclobutene (BCB) polymer, polyimide (PI), polybenzoxazole (PBO) or a combination thereof.

In some embodiments, the semiconductor device 10 is a system on integrated circuit (SoIC). In some alternative embodiments, the semiconductor device 10 is further integrated with flip chip package, a chip on wafer on substrate package (CoWoS) or an integrated fan-out (InFO) package. In some alternative embodiments, the integrated circuit 100 and a base die are face-to-back bonded, in which the integrated circuit 100 has its front surface facing a back surface of the base die. The base die may include a through substrate via, which extends through a substrate and a dielectric layer between the substrate and the bonding dielectric layer 182. In such embodiments, the bonding pad 184a of the integrated circuit 100 is bonded to the through substrate via of the base die, and the bonding dielectric layer 182 of the integrated circuit 100 is bonded to the dielectric layer of the base die. In some alternative embodiments, after the integrated circuit 100 is face-to-back bonded to the base die, at least one integrated circuit 100 is further stacked on the integrated circuit 100, so as to form a multilayer stack structure.

In some embodiments, the conductive pad includes a plurality of dielectric pattern and/or a plurality of holes therein, and thus the conductor density of the conductive pad directly over the through via is reduced. Accordingly, the peel stress causing the through via peeling from the dielectric layer therearound is relieved.

In accordance with some embodiments of the disclosure, an integrated circuit includes a substrate, a through via, a conductive pad and at least one via. The through via is disposed in the substrate. The conductive pad is disposed over and electrically connected to the through via, and the conductive pad includes at least one dielectric pattern therein. The via is disposed between and electrically connected to the through via and the conductive pad.

In accordance with some embodiments of the disclosure, an integrated circuit includes a substrate, a through via, a conductive pad and at least one via. The through via is disposed in the substrate. The conductive pad is disposed over and electrically connected to the through via, and the conductive pad includes a conductive main body and a plurality of holes in the conductive main body. The via is disposed between and electrically connected to the through via and the conductive pad, wherein the holes surround the via.

In accordance with some embodiments of the disclosure, an integrated circuit includes a substrate, a through via and a conductive pad. The through via is disposed in the substrate. The conductive pad is disposed in an etch stop layer and a dielectric layer on the etch stop layer, and the conductive pad electrically connected to the through via. The conductive pad includes a conductive main body, a first dielectric pattern and a second dielectric pattern on the first dielectric pattern. A material of a first dielectric pattern is the same as a material of the etch stop layer, and a material of a second dielectric pattern is different from the material of the first dielectric pattern and the same as a material of the dielectric layer.

In accordance with some embodiments of the disclosure, an integrated circuit includes a conductive pad. The conductive pad includes at least one dielectric pattern therein, wherein the at least one dielectric pattern penetrates a surface of the conductive pad.

In accordance with some embodiments of the disclosure, an integrated circuit includes a conductive pad. The conductive pad includes a conductive main body and at least one hole in the conductive main body, wherein the at least one hole penetrates a surface of the conductive main body.

In accordance with some embodiments of the disclosure, an integrated circuit includes a conductive pad and a dielectric layer over the conductive pad. The dielectric layer is extended into the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a conductive pad, comprising at least one dielectric pattern therein, wherein the at least one dielectric pattern penetrates a surface of the conductive pad; and
   a through via in a substrate, wherein the conductive pad is electrically connected to the through via through a conductive via between the through via and the conductive pad.

2. The integrated circuit according to claim 1, wherein the conductive pad is physically connected to the through via through the conductive via between the through via and the conductive pad.

3. The integrated circuit according to claim 1, wherein a horizontal distance between an outer sidewall of the conductive pad and the at least one dielectric pattern is larger than a horizontal distance between the outer sidewall of the conductive pad and the conductive via.

4. The integrated circuit according to claim 1, wherein a projection of the at least one dielectric pattern onto the substrate is not disposed outside a projection of the through via onto the substrate.

5. The integrated circuit according to claim 1, wherein the at least one dielectric pattern comprises a plurality of dielectric patterns, and the dielectric patterns are arranged along a periphery of the conductive pad.

6. The integrated circuit according to claim 5, wherein outer sidewalls of the dielectric patterns are arranged to form a ring-like shape.

7. The integrated circuit according to claim 1, wherein the at least one dielectric pattern comprises a plurality of first dielectric patterns and at least one second dielectric pattern, and the first dielectric patterns are arranged to surround the at least one second dielectric pattern.

8. The integrated circuit according to claim 1, wherein the at least one dielectric pattern comprises a plurality of dielectric patterns, and each of the dielectric patterns penetrates the surface of the conductive pad.

9. An integrated circuit, comprising:
   a conductive pad, comprising a conductive main body and at least one hole in the conductive main body, wherein the at least one hole penetrates a surface of the conductive main body; and
   a dielectric pattern partially in the at least one hole.

10. The integrated circuit according to claim 9, wherein a bottom of the at least one hole is substantially flush with a bottom of the conductive main body.

11. The integrated circuit according to claim 9, wherein the at least one hole comprises a plurality of holes, and each of the holes penetrates through the conductive main body.

12. The integrated circuit according to claim 9, wherein a height of the at least one hole is smaller than a largest height of the conductive main body.

13. The integrated circuit according to claim 9, further comprising a dielectric layer over the conductive pad, wherein the dielectric layer partially fills the at least one hole to form the dielectric pattern.

14. An integrated circuit, comprising:
    a conductive pad; and
    a dielectric layer over the conductive pad, wherein the dielectric layer is extended into the conductive pad; and
    a conductive via disposed in the dielectric layer and electrically connected to the conductive pad.

15. The integrated circuit according to claim 14, wherein the dielectric layer is an etch stop layer.

16. The integrated circuit according to claim 14, wherein the dielectric layer is extended over an entire top surface of the conductive pad.

17. The integrated circuit according to claim 14, wherein the dielectric layer comprises a first dielectric layer and a second dielectric layer on the first dielectric layer, and a portion of the second dielectric layer extended into the conductive pad is surrounded by a portion of the first dielectric layer extended into the conductive pad.

18. The integrated circuit according to claim 14, wherein the conductive pad comprises a hole beneath the dielectric layer extended into the conductive pad.

19. The integrated circuit according to claim 9, wherein the dielectric pattern comprises a first layer in the at least one hole and a second layer surrounding the first layer and disposed between the first layer and the at least one hole.

20. The integrated circuit according to claim 14, wherein the conductive via is further disposed in an etch stop layer.

\* \* \* \* \*